(12) United States Patent
Daley et al.

(10) Patent No.: US 7,687,406 B2
(45) Date of Patent: Mar. 30, 2010

(54) METHODS OF ELIMINATING PATTERN COLLAPSE ON PHOTORESIST PATTERNS

(75) Inventors: Jon Daley, Boise, ID (US); Yoshiki Hishiro, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 111 days.

(21) Appl. No.: 11/487,403

(22) Filed: Jul. 17, 2006

(65) Prior Publication Data

US 2006/0257758 A1    Nov. 16, 2006

Related U.S. Application Data

(62) Division of application No. 10/819,936, filed on Apr. 8, 2004, now Pat. No. 7,119,025.

(51) Int. Cl.
*H01L 21/302* (2006.01)
*H01L 21/461* (2006.01)

(52) U.S. Cl. ........................ 438/725; 438/780; 438/781; 438/782

(58) Field of Classification Search ................. 438/725, 438/780–782
See application file for complete search history.

(56) References Cited

U.S. PATENT DOCUMENTS

| 4,873,177 | A | 10/1989 | Tanaka et al. |
| 5,292,605 | A | 3/1994 | Thomson |
| 5,536,616 | A | 7/1996 | Frechet et al. |
| 5,962,186 | A | 10/1999 | Park et al. |
| 6,120,945 | A | 9/2000 | Tanaka et al. |
| 6,130,166 | A | 10/2000 | Yeh |
| 6,451,510 | B1 | 9/2002 | Messick et al. |
| 6,605,413 | B1 * | 8/2003 | Lyons et al. ................ 430/314 |
| 2004/0121588 | A1 | 6/2004 | Choi |

* cited by examiner

*Primary Examiner*—Thien F Tran
(74) *Attorney, Agent, or Firm*—Dickstein Shapiro LLP

(57) ABSTRACT

A stabilizing solution for treating photoresist patterns and methods of preventing profile abnormalities, toppling and resist footing are disclosed. The stabilizing solution comprises a non-volatile component, such as non-volatile particles or polymers, which is applied after the photoresist material has been developed. By treating the photoresist with the solution containing a non-volatile component after developing but before drying, the non-volatile component fills the space between adjacent resist patterns and remains on the substrate during drying. The non-volatile component provides structural and mechanical support for the resist to prevent deformation or collapse by liquid surface tension forces.

10 Claims, 6 Drawing Sheets

METHODS OF ELIMINATING PATTERN COLLAPSE ON PHOTORESIST PATTERNS

CROSS REFERENCE TO RELATED APPLICATIONS

The present application is a divisional of U.S. application Ser. No. 10/819,936, filed Apr. 8, 2004 now U.S. Pat. No. 7,119,025, the disclosure of which is herewith incorporated by reference in its entirety.

FIELD OF THE INVENTION

The invention relates to the fabrication of electronic components such as integrated circuit semiconductors and, in particular, to methods for avoiding resist pattern collapse in the photolithography steps of integrated circuit fabrication.

BACKGROUND OF THE INVENTION

Photolithographic patterning is a well-established technology in the manufacturing processes of various kinds of semiconductor devices and liquid crystal display panels. According to photolithographic patterning, a photosensitive resist composition is first coated onto a surface of a substrate to form a photoresist layer. The photoresist layer is then exposed to radiation, such as ultraviolet light or electron beam, so that some portions of the photoresist are impacted by radiation while other portions of the photoresist are not impacted by the radiation. Subsequently, the photoresist is subjected to a developer solution, which selectively removes either the impacted or non-impacted portions of the photoresist. If the photoresist is a positive photoresist, the impacted portions are selectively removed; if the photoresist is a negative photoresist, the non-impacted portions are selectively removed. The photoresist material remaining after development shields or masks the regions of the substrate from subsequent etch or implant operations.

The development process of photoresist is conducted to provide the pattern which will serve as a mask for etching, ion-implantation or lift-off, for example, on the substrate. One of the goals of an effective development process is minimizing pattern distortion. Pattern distortion is the result of many factors, two primary ones being resist roughness and surface tension. Surface tension pulls down the walls of the photoresist (also known as toppling) during the rinsing and drying steps of the development process, therefore destroying the pattern that was originally formed. As illustrated in FIG. 1, for example, fine lines formed by photoresist are used to pattern electrical connections onto a blanket layer, for example a blanket metal layer. When the walls of the photoresist topple, the connections cannot be properly placed onto the blanket metal layer. Toppling of the photoresist causes damage to the substrate, is costly as substrates must be scrapped, and time consuming.

Accordingly, there is a need for a photoresist stabilizing solution that will reduce or eliminate the toppling of the photoresist, therefore improving manufacturing efficiency and production yields. Also needed are methods of increasing the mechanical and structural strength of photoresist patterns to prevent deformation, profile abnormalities or collapse by liquid surface tension forces in high density semiconductor fabrication.

SUMMARY OF THE INVENTION

The present invention provides a stabilizing solution for treating photoresist patterns to prevent profile abnormalities, toppling and resist footing. The stabilizing solution comprises a non-volatile component, such as non-volatile particles or polymers, which is applied after the photoresist material has been developed. By treating the photoresist with the solution containing a non-volatile component after developing but before drying, the non-volatile component fills the space between adjacent resist patterns and remains on the substrate during drying. In this manner, the non-volatile component provides structural and mechanical support for the resist to prevent deformation or collapse by liquid surface tension forces.

The present invention also provides a method of stabilizing a photoresist layer. The method comprises the steps of forming a photoresist layer on a substrate, exposing the photoresist layer through a mask to create an exposed area of photoresist and an unexposed area of photoresist; developing the photoresist layer; and applying a stabilizing treatment to the photoresist layer without changing the physical and chemical properties of the photoresist.

Additional advantages and features of the present invention will be apparent from the following detailed description and drawings which illustrate preferred embodiments of the invention.

DETAILED DESCRIPTION OF THE INVENTION

Figure 1:
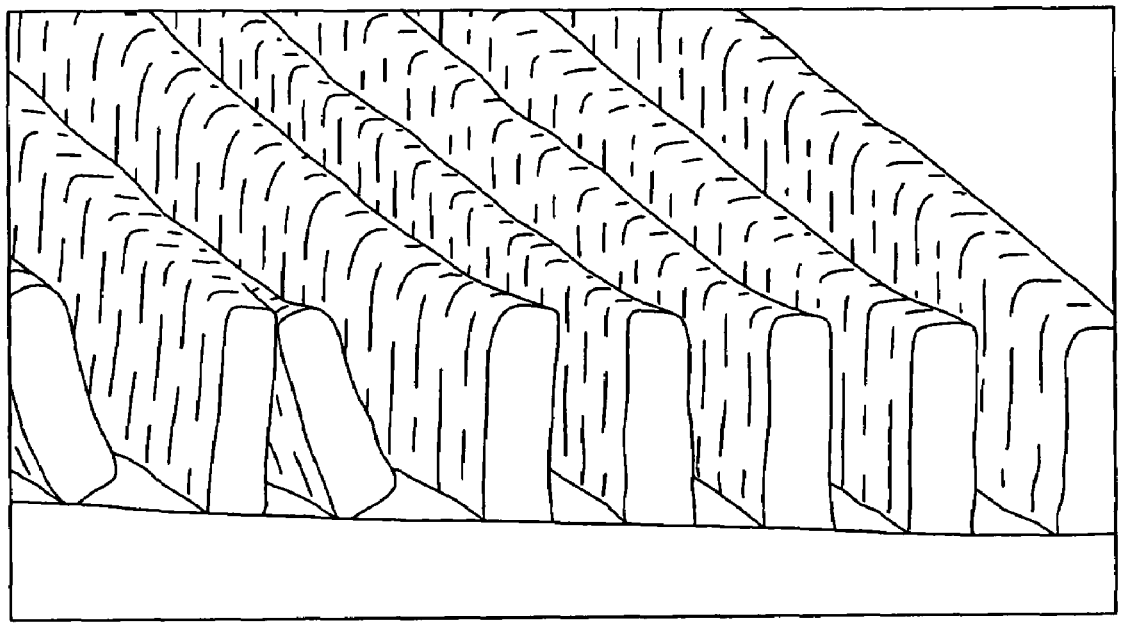
FIG. 1 is a photographic illustration of a toppled photoresist of the prior art.

In the following detailed description, reference is made to various specific embodiments in which the invention may be practiced. These embodiments are described with sufficient detail to enable those skilled in the art to practice the invention, and it is to be understood that other embodiments may be employed, and that structural and logical changes may be made without departing from the spirit or scope of the present invention.

The terms "substrate" and "wafer" can be used interchangeably in the following description and may include any semiconductor-based structure or insulating structure on or at the surface if which circuitry may be formed. The structure should be understood to include silicon, silicon-on insulator (SOI), silicon-on-sapphire (SOS), doped and undoped semiconductors, epitaxial layers of silicon supported by a base semiconductor foundation, and other semiconductor and insulating structures. The semiconductor need not be silicon-based. The semiconductor could be silicon-germanium, germanium, or gallium arsenide. When reference is made to the substrate in the following description, previous process steps may have been utilized to form regions or junctions in or over the base semiconductor or foundation.

The inventors of the present invention have realized that pattern density may be increased and toppling and resist profile abnormalities may be reduced if photoresist patterns are immersed in a stabilizing solution and subjected to a stabilizing treatment. In one embodiment, the stabilizing solution comprises a non-volatile component which is applied to displace at least part of the rinse solution after the photoresist material has been developed. By treating the photoresist with a solution containing a non-volatile component after developing but before drying, the non-volatile component fills the space between adjacent resist patterns and remains on the substrate during drying. In this manner, the non-volatile component provides structural and mechanical support for the resist to prevent deformation or collapse by liquid surface tension forces.

In yet another embodiment, the stabilizing solution is a polymer solution. During the developing stage, preferably during the puddle time, at least part of the developing solution is replaced with the polymer solution by spinning off and continuously adding the polymer solution, so that the developing solution is replaced by the polymer solution. Subsequent to the displacement of the developing solution by the polymer solution, the wafer is baked so that solvent (such as water, for example) from the polymer solution evaporates, living polymer material to fill in the space between adjacent resist patterns. In this manner, the remaining polymer material provides structural and mechanical support for the resist to prevent deformation or collapse by liquid surface tension forces.

In yet another embodiment of the present invention, the stabilizing solution comprises a polymer solution which replaces a developing solution used for patterning a bilayer photoresist. During the developing stage, preferably during the puddle time, at least part of the developing solution is replaced with the polymer solution by spinning off and continuously adding the polymer solution, so that the developer is replaced by the polymer solution. Subsequent to the displacement of the developer by the polymer solution, the wafer is baked so that solvent (for example, water) from the polymer solution evaporates, living polymer material to fill at least partially the space between adjacent bilayer resist patterns. In this manner, the remaining polymer material provides structural support for the bilayer resist to prevent deformation or collapse by liquid surface tension forces.

In the embodiments of the present invention, physical and chemical properties of the photoresist material are substantially retained, while high strength developed photoresist is achieved to prevent pattern collapse in high density semiconductor fabrication.

Referring now to the drawings, where like elements are designated by like reference numerals, FIGS. 2-6 illustrate a method of forming photoresist patterns using a positive photoresist according to an embodiment of the present invention. For exemplary purposes only, the embodiments below will be described with reference to a positive photoresist; however, the invention also contemplates methods of forming photoresist patterns using a negative photoresist.

For a better understanding of the present invention, a brief description of the principal characteristics of positive and negative resists will be provided below and before detailing the specific embodiments of the present invention. As known in the art, positive resists are sensitized when exposed to ultraviolet light so that exposed areas will dissolve in a developer solution leaving behind unexposed areas. In contrast, negative resists are hardened by exposure to ultraviolet light so that exposed areas are inhibited from being dissolved by the developer solution while unexposed areas are dissolved.

Positive photoresists are typically three-component materials, consisting of a matrix material, a photo-sensitive component and a solvent. Generally, the matrix components of positive photoresists are low-molecular weight phenolic polymers, acrylic polymers or other addition polymers, that provide the mechanical properties of the photoresist layer. The matrix polymers contain some level of pendant acidic site precursors such as alkyl esters. The photoresist formulation also contains a photosensitive component which, upon exposure to actinic light, for example, generates an acid. This acid catalytically cleaves the ester linkage causing the polymer to become soluble in the aqueous alkaline developer. The solvent component suspends the matrix polymer and photosensitive compound in a flowable liquid until the photoresist layer is cured with a soft-bake prior to being exposed to actinic light. Typical positive photoresist solvents include ketones, esters and alcohols, e.g., heptanone, propylene glycol methyl ether acetate, ethyl lactate, propylene glycol methyl ether.

Negative photoresists are also three-component materials, consisting of a matrix component, a sensitizer component and a solvent. Typically, negative photoresists comprise the same or similar polymers and photosensitive compounds as the positive photoresists, except that they contain cross-linkable groups rather than cleavable acid protecting groups. Negative photoresist solvents are generally similar to those used for positive photoresists.

Referring back to FIG. 2, a positive photoresist layer 15 is formed by deposition or spin coating, for example, on a layer 12 which in turn is formed over a substrate 10. The layer 12 containing the pattern lines to be formed may comprise any layer of material used in an electronic or semiconductor device, such as an insulating, metal or semiconductor layer. Preferably, layer 12 comprises an insulating layer in a semiconductor device, such as a first level insulating layer or an intermetal dielectric. Layer 12 may also comprise an antireflective coating (ARC), such as a BARC layer or a DARC layer, for example, as well-known in the art.

After the photoresist layer 15 has been formed on layer 12 over substrate 10, the photoresist layer 15 is preferably soft-baked to remove any existing solvents. For example, the soft-baking may be conducted at a temperature of about 90° C. to 150° C. for about 30 to 120 seconds on a hot plate. However, any suitable time and temperature and baking equipment may be used depending on the photoresist material.

Figure 2:
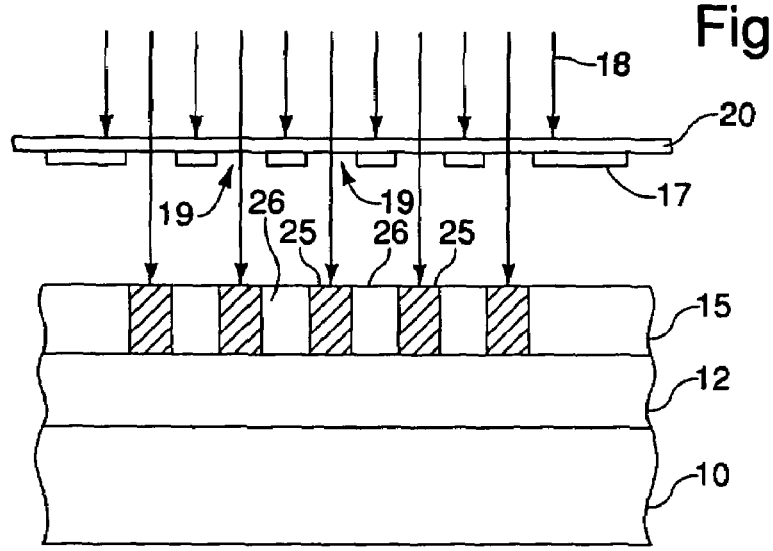
FIG. 2 is a cross-sectional view of a layer of photoresist undergoing a process according to a first embodiment of the present invention.

The photoresist layer 15 is subsequently exposed to radiation 18, such as actinic light or other suitable UV radiation, through openings 19 in the opaque pattern 17 in a mask or reticle 20 to form exposed regions 25 in the photoresist layer 15, as illustrated in FIG. 2. During this step, the exposed regions 25 of the positive photoresist layer 15 are rendered soluble to developer solution. In contrast, remaining regions 26 of the photoresist layer 15 are shielded by the opaque layer 17 of the mask 20 and are not exposed. Thus, the exposed photoresist regions 25 are separated by unexposed regions 26, which remain insoluble to the developer.

Figure 3:
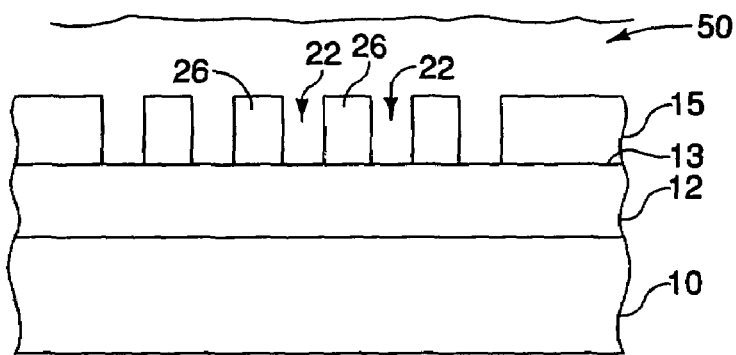
FIG. 3 shows the layer of photoresist of FIG. 2 at a stage of processing subsequent to that shown in FIG. 2.

After the exposing step, the photoresist layer 15 is developed to remove the exposed photoresist regions 25 from the unexposed regions 26 and to provide openings 22 within the photoresist layer 15, as shown in FIG. 3. Photoresist regions 26 are not removed during development and are used in subsequent steps and processes, such as etching or implanting of the underlying layer 12. The photoresist layer 15 may be developed by any of the methods known in the art, including but not limited to quiescence, immersion, spray and puddle development. A brief description of these development methods is provided below.

The quiescense method adds developer to the exposed wafer surface and, after a period of time sufficient to develop the pattern, a rinse composition is added to the wafer surface and the wafer is then dried.

The immersion process comprises dipping the exposed semiconductor wafer into a bath of the developer composition for a predetermined period of time, and then removing the wafer from the bath. After the wafer has been removed from the immersion bath, it is immersed in a rinse bath. A displacement rinse method may be used using the same tank for both the development immersion and rinsing. Instead of immersing the developed wafer, the immersed wafer could be rinsed by spraying.

In the spray development method, the exposed wafer is sprayed with the developing composition for a certain period of time to develop the pattern typically for about 1 to 2 minutes. The developed wafer is then sprayed with the rinse composition to rinse the developer from the wafer surface. The rinse composition is typically sprayed for about 1 to 2 minutes and then dried using conventional techniques such as air drying.

In the puddle development process, which is the preferred development method in the present invention, the developing composition is puddled onto the exposed semiconductor wafer while the wafer is at rest and then the wafer is spun slowly at, for example, 100 rpm to distribute the developing composition over the wafer surface. The developer is then left on the wafer surface for sufficient time to develop the pattern, for example about 10 seconds to 2 minutes. The rinse composition is then puddled onto the still wet wafer surface typically while the wafer is at rest and spun similarly to the developing composition to rinse the wafer.

The developing composition which may be used in the methods of the present invention may be any suitable commercial developer. Developing compositions are typically basic and may contain potassium hydroxide, sodium hydroxide, sodium silicate and the like as the principal component, but it is preferred that the basic component be a basic organic compound which is free from metal ions such as tetramethyl ammonium hydroxide.

In the developing step, which can employ any of the development methods described above, the exposed areas 25 of positive photoresist layer 15 are removed by a developing solution to leave the desired pattern image on surface 13 of the layer 12. At the end of the developing step, the surface 13 is rinsed to stop the developing reaction and remove the developer solution from the surface. As noted above, typical positive resist developer solutions are alkaline solutions diluted with water, which require only a water rinse. Negative resist developer solutions may be organic solvents, which require rinsing with other organic solvents (e.g. n-butyl acetate). Thus, for the positive photoresist layer 15 described above, a rinse solution such as an aqueous rinse, for example deionized (DI) water rinse, is conducted to stop the developing reaction and remove the developer solution from the surface 13 of the layer 12. The rinse solution rapidly dilutes the developer chemical so that the developing action stops. The rinse also removes any partially polymerized pieces of resist from the open regions in the resist film.

As illustrated in FIG. 3, subsequent to the development and rinse of the photoresist layer 15 but before drying, the rinse solution is displaced by a stabilizing solution or suspension 50 containing at least one non-volatile component and the substrate is subjected to a stabilizing treatment according to a method of the present invention. Solution 50 containing at least one non-volatile component is applied to the remaining positive photoresist layer 15 (i.e., the unexposed resist 26) by displacing at least part of the rinse solution. In a preferred embodiment, the solution 50 containing non-volatile components is added to gradually replace the rinse solution. However, it must be understood that the invention also contemplates embodiments wherein the solution 50 containing non-volatile components is applied to the substrate 10 by immersing the substrate in a separate bath containing the solution 50 containing non-volatile components. In addition, the solution 50 containing non-volatile components may be applied only to one area of interest of the photoresist layer 15, whereas the other remaining photoresist areas may be subjected to a drying process, for example. In this case, only the area of interest of the photoresist layer 15 may be immersed or submerged in the solution 50 containing non-volatile components, while the rest of the substrate may be allowed to dry.

The solution or suspension 50 containing at least one non-volatile component of the present invention may comprise a solvent (such as water, for example) and any non-volatile component that can be dry etched highly selectable to the photoresist material 15. For example, the non-volatile component may comprise non-volatile particles such as silica gel particles (SiOx particles), graphite particles, Bucky balls (C60) or latex spheres, among many others, or combinations of such particles. The non-volatile component may also comprise precipitants such as glucose, sugar or starch, or a combination of non-volatile particles and precipitants.

Figure 4:
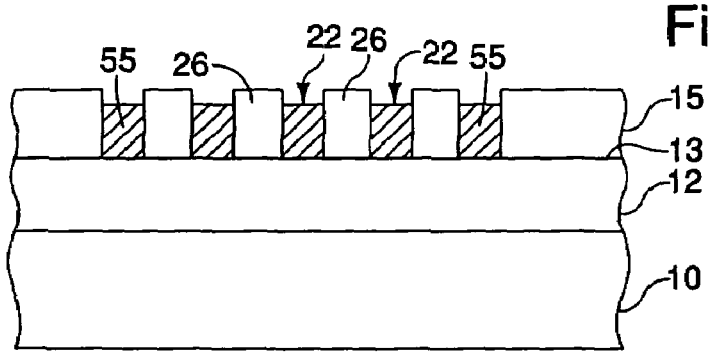
FIG. 4 shows the layer of photoresist of FIG. 2 at a stage of processing subsequent to that shown in FIG. 3.

Reference is now made to FIG. 4. Subsequent to the displacement of the rinse solution with the solution 50 containing at least one non-volatile component of the present invention, substrate 10 is subjected to a heat treatment, for example a bake at about 90° C. to about 200° C., so that water or the solvent of the solution 50 containing at least one non-volatile component evaporates, living non-volatile component 55 filling in the space between adjacent regions 26 of the photoresist layer 15. Although the non-volatile component 55 is illustrated in FIG. 4 as only partially filling in the space between adjacent photoresist regions 26, the invention also contemplates the embodiment wherein the non-volatile component 55 completely fills in the space between adjacent photoresist regions 26. The non-volatile component 55 remaining between adjacent photoresist regions 26 acts as a support layer and provides structural and mechanical support for the photoresist regions 26 to prevent deformation or collapse of these regions by liquid surface tension forces during any additional rinse steps. Thus, although the physical and chemical properties of the photoresist material of the photoresist regions 26 are not altered, high strength developed photoresist patterns are achieved to prevent pattern collapse in high density semiconductor fabrication.

Figure 5:
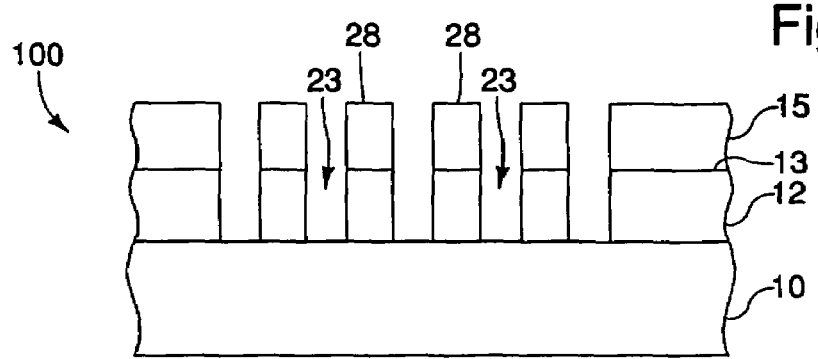
FIG. 5 shows the layer of photoresist of FIG. 2 at a stage of processing subsequent to that shown in FIG. 4.

The structure of FIG. 4 is then subjected to an etching process to remove the non-volatile component 55 from the substrate and to further etch the layer 12 to form photolithographic pattern 100 comprising desired patterns or lines 28 provided within layer 12, as shown in FIG. 5. The etching process may be a dry etching, such as a plasma etching (for example an $O_2$ plasma etching), or a wet etching employing a liquid etching medium, which removes the non-volatile component 55 and etched below the underlying surface 13 and within the layer 12 through openings 23, as illustrated in FIG. 5. In this manner, patterns or lines 28 are formed within the layer 12 by employing photoresist patterns, such as the photoresist regions 26 of FIGS. 3-4, which have reduced toppling and increased strength.

Subsequent to the removal of the non-volatile component 55, the structure of FIG. 5 is dried and optionally treated with ultraviolet radiation to reduce the tendency of the photoresist to flow during subsequent processing steps where the photoresist will experience high temperatures, which may including bake cycles, plasma etching, ion implantation and ion milling, for example. This treatment is typically accomplished by irradiating the dried photoresist with deep UV while heating the substrate to a high temperature (e.g., 120-190° C.) for approximately a minute. Alternatively, the developed, rinsed, treated and dried photoresist layer may be further treated by irradiating the surface with electron beams with energies of about 1 to 100 KeV.

The embodiment of the present invention described above is further explained with reference to the following example and in conjunction with FIG. 6. The invention is not intended to be limited to the particular example described below:

EXAMPLE 1

A bare silicon wafer was processed with 2800A AR360 resist on 450A Dongjin Barc and exposed with a reticle at standard exposure/focus. The wafer received a standard post-exposure bake. The wafer was subsequently developed and rinsed in a dump rinse tank, and then pulled out from the tank and placed horizontally. A Klebesol slurry using silica particles was applied to the wafer before the drying process could induce collapse (toppling) of the patterns 26a (FIG. 6). The time from the pulling out of the tank of the wafer to applying the Klebesol slurry was preferably under 10 seconds, to avoid collapse of the patterns.

Figure 6:
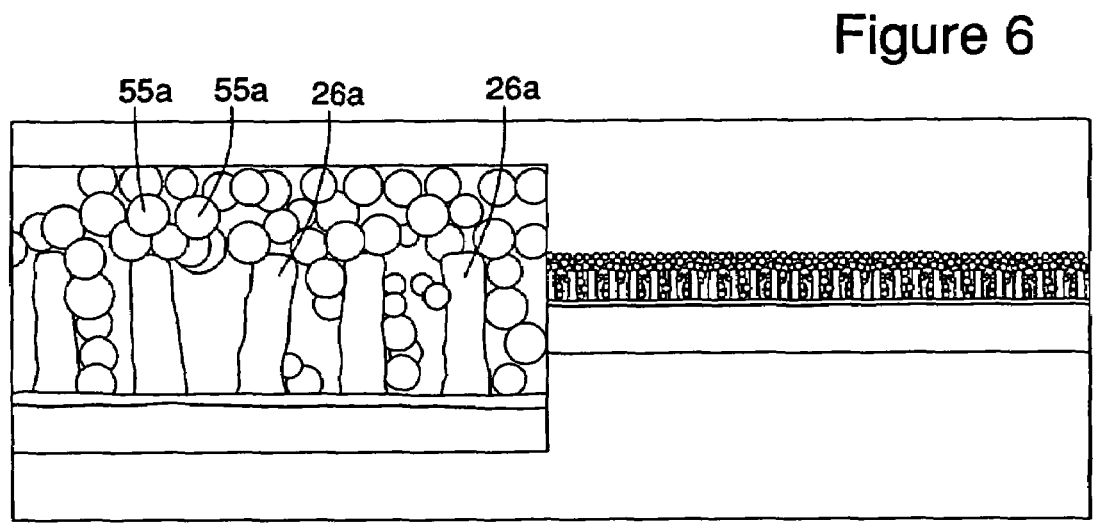
FIG. 6 shows a microphotograph of a layer of photoresist undergoing a process according to the first embodiment of the present invention.

FIG. 6 is a photograph illustrating silica particles 55a of the Klebesol slurry physically supporting resist lines 26a without collapse, fabricated as detailed in Example 1. As shown in FIG. 6, the resist lines 26a have a vertical and substantially defect-free profile, with virtually no pattern collapse and no resist footing or profile abnormalities. The silica particles 55a were dry etched with minimal etching of the resist lines. Dry etching is preferred to a wet etching, as a wet etching may induce surface tension which, in turn, may produce collapse.

Reference is now made to FIGS. 7-10, which illustrate another exemplary embodiment of the method of the present invention, according to which a stabilizing solution comprising a non-volatile polymer component displaces a developing solution. During the developing stage, preferably during the puddle time, the developing solution is replaced with a polymer solution by spinning off and continuously adding the polymer solution. Subsequent to the displacement of the developing solution by the polymer solution, the wafer is baked so that water or solvent from the polymer solution evaporates, living polymer material to fill in the space between adjacent resist patterns. The remaining polymer material provides structural and mechanical support for the resist to prevent deformation or collapse by liquid surface tension forces. The polymer solution may replace the rinse solution or, alternatively, may be employed in conjunction with the rinse solution.

Figure 7:
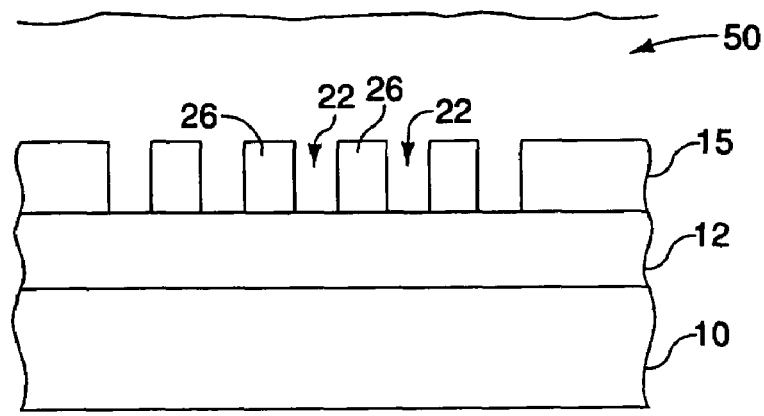
FIG. 7 shows the layer of photoresist of FIG. 2 at a stage of processing subsequent to that shown in FIG. 2 and in accordance with a second embodiment of the present invention.

FIG. 7 illustrates the structure of FIG. 3 at the end of the development stage and formed as described in detail above with reference to the first exemplary embodiment of the present invention. Subsequent to the development of the photoresist layer 15 but before drying, the developing solution is displaced by a polymer solution or suspension 150 and the substrate is subjected to a stabilizing treatment according to a method of the present invention. Polymer solution 150 is applied to the remaining positive photoresist layer 15 (i.e., the unexposed resist 26) by displacing at least part of the developing solution. In a preferred embodiment, the polymer solution 150 displaces the developing solution and is added to gradually replace the developing solution. However, it must be understood that the invention also contemplates embodiments wherein the polymer solution 150 is applied to the substrate by immersing the substrate in a separate bath containing the polymer solution 150. In addition, the polymer solution 150 may be applied only to one area of interest of the photoresist layer 15, whereas the other remaining areas are subjected to a drying process, for example. In this case, only the area of interest of the photoresist layer 15 may be immersed or submerged in the solution 150, while the rest of the substrate may be allowed to dry.

The polymer solution 150 of the present invention may comprise any non-volatile polymer component that can be dry etched highly selectable to the photoresist material 15. In addition, the non-volatile polymer component needs to be soluble in a suitable solvent to form the polymer solution 150. For example, in one embodiment of the present invention, the polymer solution 150 is an aqueous polymer solution which may comprise PVA (polyvinyl alcohol) or any polymer, such as for example, an acrylic polymer, which is soluble in water. The polymer may further comprise chemical cross-links throughout the polymer. Exemplary polymers include homopolymers and copolymers comprising polyhydroxyethylmethacrylate, polymethylmethacrylate, substituted polymethylmethacrylate, and polystyrene, among others. The polymer may also comprise an acidic unit (if the resist needs to be smoothed effectively) or, alternatively, an acidic additive may be subsequently added to the aqueous polymer solution 150.

In another embodiment of the present invention, the polymer solution 150 may comprise PVA (polyvinyl alcohol) or any polymer such as the ones described above and further in combination with a polymeric precursor (which may include cross-linking materials) suspended or dissolved in a suitable solvent (and further optionally comprising water). Solvents can include, for example, ethyl lactate, methylamylketone, polypropyleneglycol monomethyletheracetate (PGMEA), and propyleneglycol monomethylether (PGME), in applications in which the polymeric precursors comprise benzoyl peroxide, benzil and/or benzil derivatives, together with cross-linking materials selected from the group consisting of hexamethoxymethirol melamine and tetramethoxyglycouril.

Figure 8:
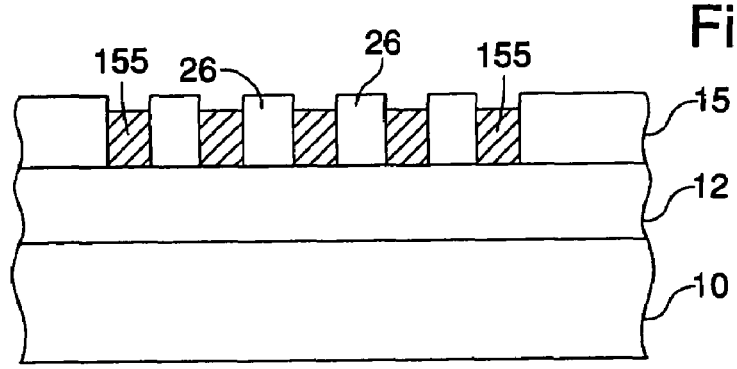
FIG. 8 shows the layer of photoresist of FIG. 7 at a stage of processing subsequent to that shown in FIG. 7.

Subsequent to the displacement of the developing solution with the polymer solution 150 of the present invention, substrate 10 is subjected to a heat treatment, for example a bake at about 90° C. to about 200° C., so that the water or the solvent (or a combination of water/solvent) of the polymer solution 150 evaporates, living non-volatile polymer 155 filling in the space between adjacent regions 26 of the photoresist layer 15. Although the non-volatile polymer 155 is illustrated in FIG. 8 as totally filling in the space between adjacent photoresist regions 26, the invention also contemplates embodiments wherein the non-volatile polymer 155 only partially fills in the space between adjacent photoresist regions 26. As in the previously-described embodiment, the non-volatile polymer 155 remaining between adjacent photoresist regions 26 acts as a support layer and provides structural and mechanical support for the photoresist regions 26, to prevent deformation or collapse of these regions.

Figure 9:
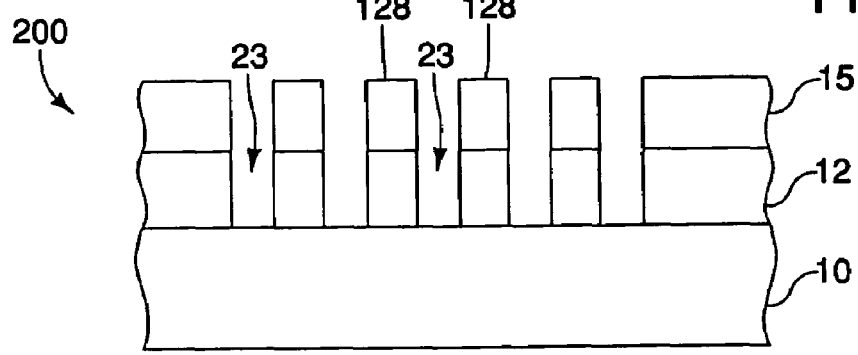
FIG. 9 shows the layer of photoresist of FIG. 7 at a stage of processing subsequent to that shown in FIG. 8.

The structure of FIG. 8 is then subjected to an etching process to remove the non-volatile polymer 155 from the substrate and to further etch the layer 12 to form photolithographic pattern 200 comprising desired patterns or lines 128 within layer 12, as shown in FIG. 9. Depending on the nature of the polymer, the etching process may be a dry etching, such as a plasma etching, or a wet etching employing a liquid, which is permitted to remove the non-volatile polymer 155 and to reach the underlying surface 13 of the layer 12 through openings 23, as illustrated in FIG. 9. In this manner, patterns or lines 128 are formed within the layer 12 by employing photoresist patterns, such as the photoresist regions 26 of FIGS. 7-8, which have reduced toppling and increased strength.

Subsequent to the removal of the non-volatile polymer 155, the structure of FIG. 9 is dried and optionally treated with ultraviolet radiation to reduce the tendency of the photoresist to flow during subsequent process steps, as in the previously-described embodiment.

The second embodiment of the present invention described above is further explained with reference to the following example and in conjunction with FIG. 10. The invention is not intended to be limited to the particular example described below:

EXAMPLE 2

A bare silicon wafer was processed with 2000A AR360 resist from JSR on 450A Dongjin Barc. After the resist formation, the wafer was baked at a temperature of about 130° C. for about 90 seconds and then exposed on an ASML scanner PAS1100. The wafer was baked again, at a temperature of about 130° C. for about 90 seconds. The wafer was subsequently developed with ARCH 4262 developer for about 30 seconds. While spinning the developer on the wafer, a TOK FSC050 polymer solution was added by spin coating to displace the developer. The wafer was rinsed in a dump rinse tank, and then pulled out from the tank and baked at a temperature of about 170° C. for about 60 seconds. After the baking, a de-ionized (DI) water rinse was applied.

Figure 10:
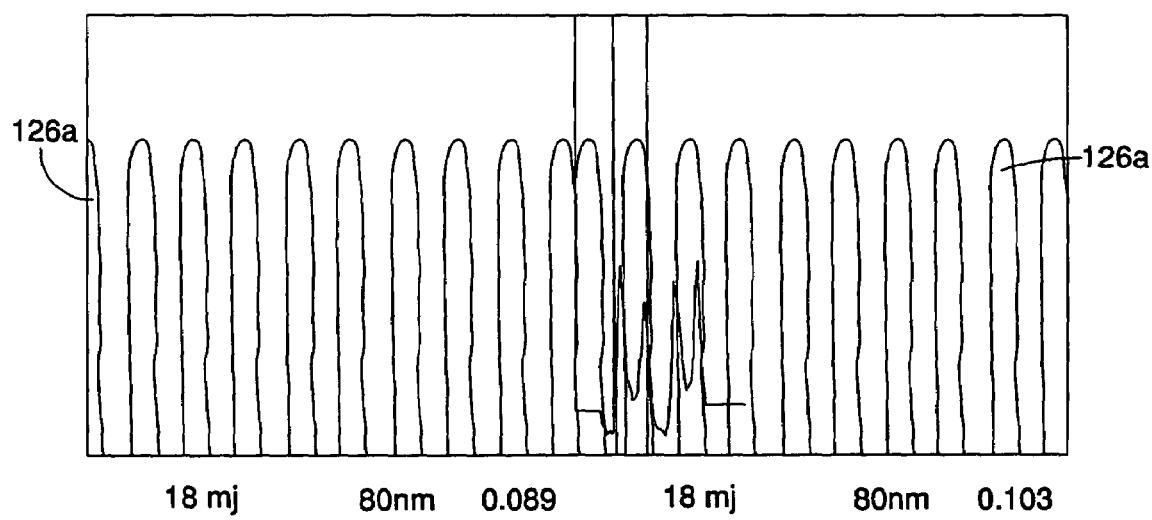
FIG. 10 shows a microphotograph of a layer of photoresist undergoing a process according to the second embodiment of the present invention.

FIG. 10 is a photograph illustrating resist pattern lines 126a without profile abnormalities and without toppling, fabricated as detailed in Example 2 above. As shown in FIG. 10, the resist lines 126a have a vertical and substantially defect-free profile, with virtually no pattern collapse and minimal resist roughness or profile abnormalities.

Although the embodiment above has been described with reference to the polymer solution 150 displacing the developing solution and used in lieu of a rinse solution, it must be understood that the invention is not limited to this embodiment and also contemplates using the polymer solution 150 in conjunction with a rinse solution. In this case, the rinse solution is applied subsequently to the polymer solution 150 and before the drying step. For the positive photoresist layer 15 of FIG. 7, a rinse solution such as a de-ionized (DI) water rinse may be applied to remove any partially polymerized pieces of resist from the open regions in the resist film.

Figure 11:
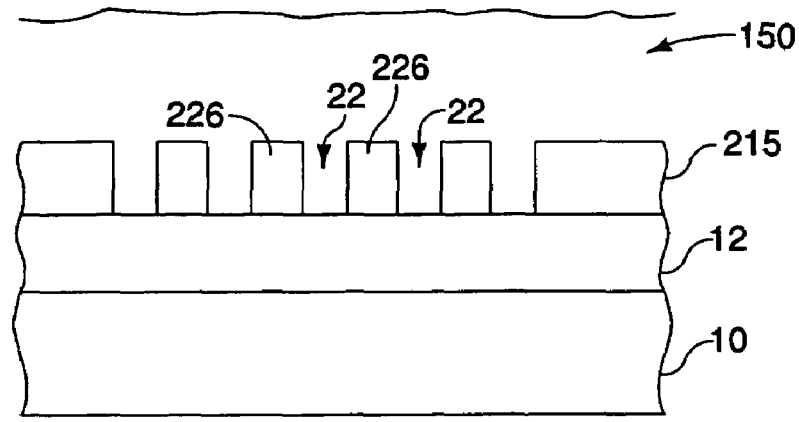
FIG. 11 is a cross-sectional view of a bilayer photoresist undergoing a process according to a third embodiment of the present invention.
Figure 12:
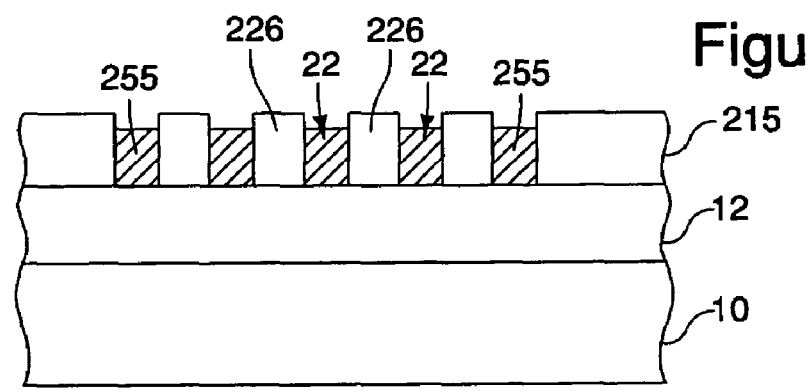
FIG. 12 shows the bilayer photoresist of FIG. 11 at a stage of processing subsequent to that shown in FIG. 11.
Figure 13:
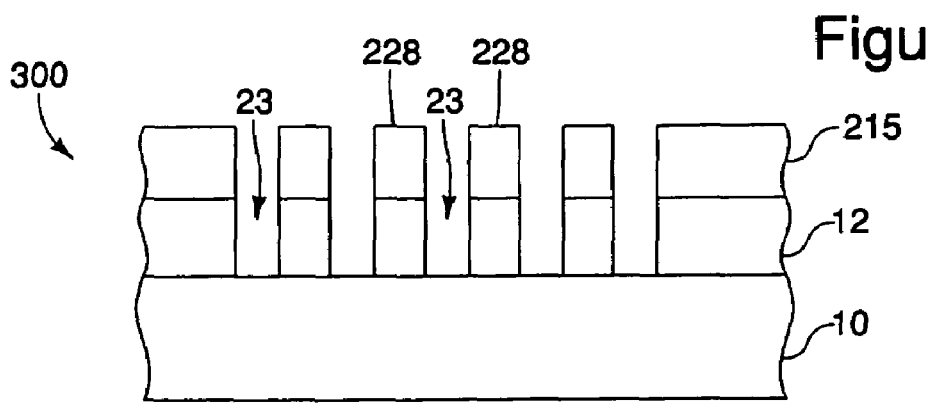
FIG. 13 shows the bilayer photoresist of FIG. 11 at a stage of processing subsequent to that shown in FIG. 12.

FIGS. 11-13 illustrate yet a third embodiment of the present invention, according to which resist patterns or lines having a vertical and substantially defect-free profile are formed within a bilayer photoresist 215, and not within a photoresist layer, such as the photoresist layer 15 as in the previously described embodiments. Thus, FIGS. 11-13 illustrate a method of forming resist lines and patterns having no pattern collapse and no resist roughness or profile abnormalities, similar in part to that described above with reference to FIGS. 7-9, but different in that the photoresist layer 15 of FIGS. 7-9 is replaced with a bilayer photoresist 215 in FIGS. 11-13.

Accordingly, FIG. 11 illustrates non-exposed photoresist regions 226 of the bilayer photoresist 215 at the end of the development stage. The bilayer photoresist 215 may be any known bilayer photoresist known in the art, such as for example, DPSC-011 from TOK or SR2420 from Shipley Co., among others. Subsequent to the development of the bilayer photoresist 215 but before drying, the developing solution is displaced by a polymer solution or suspension 150 and the substrate is subjected to a stabilizing treatment according to a method of the present invention. Polymer solution 150 is applied to the remaining bilayer photoresist 215 (i.e., the unexposed resist 226) by displacing at least part of the developing solution. In a preferred embodiment, the polymer solution 150 is added to gradually replace the developing solution but, as in the previously-described embodiments, the invention is not limited to this embodiment. In addition, the polymer solution 150 may be applied only to one area of interest of the bilayer photoresist 215, whereas the other remaining areas are subjected to a drying process, for example.

Subsequent to the displacement of the developing solution with the polymer solution 150 of the present invention, substrate 10 is subjected to a heat treatment, for example a bake at about 90° C. to about 200° C., so that the water or the solvent (or a combination of water/solvent) of the polymer solution 150 evaporates, living non-volatile polymer 255 (FIG. 12) filling in the space between adjacent regions 226 of the bilayer photoresist 215. Although the non-volatile polymer 255 is illustrated in FIG. 12 as totally filling in the space between adjacent photoresist regions 226, the invention also contemplates the embodiment wherein the non-volatile polymer 255 only partially fills in the space between adjacent photoresist regions 226. The non-volatile polymer 255 remaining between adjacent photoresist regions 226 acts as a support layer and provides structural and mechanical support for the photoresist regions 226 to prevent deformation or collapse of these regions.

The structure of FIG. 12 is then subjected to an etching process to remove the non-volatile polymer 255 from the substrate and to further etch the layer 12 to form photolithographic pattern 300 comprising desired patterns or lines 228 within layer 12, as shown in FIG. 13. Depending on the nature of the polymer, the etching process may be a dry etching, such as a plasma oxygen etching, or a wet etching employing a liquid etching medium, which is permitted to remove the non-volatile polymer 255 and to reach the underlying surface 13 of the layer 12 through openings 23, as illustrated in FIG. 13. In this manner, patterns or lines 228 are formed within the layer 12 by employing bilayer photoresist patterns, such as the photoresist regions 226 of FIGS. 11-12, which have reduced toppling and increased strength.

Subsequent to the removal of the non-volatile polymer 255, the structure of FIG. 12 is dried and optionally treated with ultraviolet radiation to reduce the tendency of the photoresist to flow during subsequent process steps, as in the previously-described embodiment.

Although the embodiment above has been described with reference to the polymer solution 150 displacing the development solution and used in lieu of a rinse solution, it must be understood that the invention is not limited to this embodiment and also contemplates using the polymer solution 150 in conjunction with a rinse solution. In this case, the rinse solution is applied subsequent to the polymer solution 150 and before the drying step. For the bilayer photoresist 215 of FIG. 11, a rinse solution such as a de-ionized (DI) water rinse may be applied to remove partially polymerized pieces of resist from the open regions in the resist film.

Although the embodiments above have been illustrated with reference to the formation of pattern lines, such as pattern lines 28, 128 and 228 of FIGS. 5, 9 and 13, respectively, it must be understood that the invention is not limited to the formation of pattern lines within a photoresist layer. Accordingly, the invention may be also employed for the formation of any semiconductor pattern that requires patterning and etching, for example, for defining any openings within a semiconductor substrate, including an insulating layer. Thus, the methods of the present invention may be also employed to form a contact hole or a capacitor hole having a high aspect ratio, typically higher than 2.0, or a combination of such structures. Referring to FIG. 5, for example, opening 23 may be of any capacitor structure or contact hole opening having a high aspect ratio of about 2.0, preferably higher than 2.0 and most preferably of about 3.0. Accordingly, the stabilizing methods and compositions of the present invention may be employed for the patterning of capacitor structures and contact holes, among others, during IC fabrication.

The above description illustrates preferred embodiments that achieve the features and advantages of the present invention. It is not intended that the present invention be limited to the illustrated embodiments. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desire to be protected by letters Patent of the Unites States is:

1. A method for developing a photoresist pattern on a semiconductor substrate for preventing collapse of the developed pattern, the method comprising:

providing a photoresist film on a semiconductor substrate;

exposing the photoresist film through a mask to create at least one exposed area of photoresist and at least one unexposed area of photoresist;

removing the at least one exposed area of photoresist; and applying a stabilizing treatment to the photoresist film, wherein the stabilizing treatment includes a non-volatile component, and wherein the stabilizing treatment provides mechanical support to the photoresist film without changing the physical and chemical properties of the photoresist film.

2. The method of claim 1, wherein the step of applying a stabilizing treatment to the photoresist film further includes removing a volatile component from the stabilizing treatment to leave the non-volatile component over the substrate and between the unexposed areas of photoresist.

3. The method of claim 2, wherein the step of removing a volatile component from the stabilizing treatment further comprises subjecting the substrate to a temperature of about 90° C. to about 200° C.

4. The method of claim 2 further comprising supplying a rinse solution to the photoresist pattern.

5. The method of claim 4 further comprising drying the photoresist pattern to form an electronic component structure.

6. The method of claim 1, wherein the non-volatile component comprises non-volatile particles selected from the group consisting of silica particles, graphite particles, latex spheres and Bucky balls.

7. The method of claim 6, wherein the non-volatile particles comprise at least one precipitant material.

8. The method of claim 7, wherein the precipitant material is glucose or starch.

9. The method of claim 1, wherein the non-volatile component comprises a polymer.

10. The method of claim 1, wherein the photoresist film is a bilayer photoresist.

* * * * *